(12) United States Patent
Binek et al.

(10) Patent No.: US 9,718,700 B2
(45) Date of Patent: *Aug. 1, 2017

(54) MAGNETOELECTRIC CHROMIA HAVING INCREASED CRITICAL TEMPERATURE

(71) Applicant: Board of Regents of the University of Nebraska, Lincoln, NE (US)

(72) Inventors: Christian Binek, Lincoln, NE (US); Peter Dowben, Crete, NE (US); Kirill Belashchenko, Lincoln, NE (US); Aleksander Wysocki, Ames, IA (US); Sai Mu, Lincoln, NE (US); Mike Street, Lincoln, NE (US)

(73) Assignee: Board of Regents of the University of Nebraska, Lincoln, NE (US)

( * ) Notice: Subject to any disclaimer, the term of this patent is extended or adjusted under 35 U.S.C. 154(b) by 108 days.

This patent is subject to a terminal disclaimer.

(21) Appl. No.: 14/629,178

(22) Filed: Feb. 23, 2015

(65) Prior Publication Data

US 2015/0243414 A1    Aug. 27, 2015

Related U.S. Application Data

(60) Provisional application No. 61/943,528, filed on Feb. 24, 2014.

(51) Int. Cl.
| | |
|---|---|
| *H01F 1/01* | (2006.01) |
| *C01G 37/027* | (2006.01) |
| *H01F 1/00* | (2006.01) |
| *H01L 43/08* | (2006.01) |
| *H01L 43/12* | (2006.01) |
| *H01F 10/00* | (2006.01) |
| *H01F 10/32* | (2006.01) |

(52) U.S. Cl.
CPC ......... *C01G 37/027* (2013.01); *H01F 1/0009* (2013.01); *H01F 10/002* (2013.01); *H01L 43/08* (2013.01); *H01L 43/12* (2013.01); *C01P 2002/50* (2013.01); *C01P 2002/72* (2013.01); *H01F 10/3268* (2013.01)

(58) Field of Classification Search
CPC ......... H01L 29/82; H01L 45/02; H01L 45/08; H01L 27/228; H03K 19/173; H03K 19/16
See application file for complete search history.

(56) References Cited

U.S. PATENT DOCUMENTS

| 4,957,773 A | 9/1990 | Spencer et al. |
| 9,276,040 B1 * | 3/2016 | Marshall ................. H01L 43/08 |

OTHER PUBLICATIONS

"Increasing the Néel temperature of magnoelectric chromia for voltage-controlled spintronics" by M. Street, et al.; in Applied Physics Letters, No. 104; Jun. 2, 2014; 4 pages.
"Effect of substitutional doping on the Néel temperature of Cr2O3" by Sai Mu, et al.; in American Physical Society, Physical Review B 87; Feb. 28, 2013; 11 pages.

* cited by examiner

*Primary Examiner* — Carol M Koslow
(74) *Attorney, Agent, or Firm* — Talem IP Law, LLP (57) ABSTRACT

A magnetoelectric composition of boron and chromia is provided. The boron and chromia alloy can contain boron doping of 1%-10% in place of the oxygen in the chromia. The boron-doped chromia exhibits an increased critical temperature while maintaining magnetoelectric characteristics. The composition can be fabricated by depositing chromia in the presence of borane. The boron substitutes oxygen in the chromia, enhancing the exchange energy and thereby increasing Néel temperature.

15 Claims, 11 Drawing Sheets

| Dopant | Ti | | | Ti$^{4+}$ | | | V | | | Cr | Mn | | | Fe | | | Co | | | Ni | | | Ni$^{2+}$ | | |
|---|---|---|---|---|---|---|---|---|---|---|---|---|---|---|---|---|---|---|---|---|---|---|---|---|---|
| Cell | Hex | Mix | | Hex | Mix | | Hex | Mix | | Bulk | Hex | Mix | | Hex | Mix | | Hex | Mix | | Hex | Mix | | Hex | Mix | |
| $d_1$ | 2.72 | 2.70 | | 2.73 | 2.72 | | 2.70 | 2.69 | | 2.65 | 2.67 (2.68) | 2.67 | 2.71 | 2.70 | 2.71 | | 2.59 | 2.63 | | 2.62 | 2.63 | | 2.63 | 2.67 | |
| $d_2$ | 2.85 | 2.88 | | | 2.91 | | 2.89 | 2.89 | | 2.88 | 2.87 (2.88) | 2.88 | 2.89 | 2.88 | | | 2.88 | 2.86 | | 2.87 | 2.87 | | 2.89 | 2.87 | |
| | 2.90 | 2.91 | | 2.89 | 2.92 | | 2.89 | 2.89 | | | 2.89 (2.89) | 2.88 | | 2.90 | 2.89 | | | | | 2.88 | 2.87 | | 2.89 | 2.87 | |
| | 2.92 | 2.93 | | | 2.93 | | | | | | 2.90 (2.90) | 2.89 | | | | | | | | 2.90 | | | | | |
| $d_3$ | 1.96 | 1.96 | | | 1.92 | | | | | | 1.92 (1.90) | 1.91 | | | | | | | | 1.89 (1.88) | 1.89 | | | | |
| | 2.02 | 2.01 | | 1.93 | 1.93 | | 1.97 | 1.97 | | 1.96 | 1.93 (1.99) | 1.94 | 1.93 | 1.91 | | | 1.91 | 1.92 | | 1.91 (1.95) | 1.95 | | 1.97 | 1.97 | |
| | 2.02 | 2.02 | | | 1.93 | | | | | | 2.03 (1.99) | 2.02 | | | | | | | | 1.99 (1.96) | 1.97 | | | | |
| | 2.05 | 2.05 | | | 2.03 | | | | | | 1.98 (1.95) | 1.98 | | | | | | | | 1.93 (1.91) | 1.92 | | | | |
| $d_4$ | 2.09 | 2.09 | | 2.02 | 2.03 | | 2.04 | 2.04 | | 2.01 | 1.99 (2.08) | 2.01 | 2.06 | 2.07 | | | 1.93 | 1.93 | | 1.95 (2.01) | 2.00 | | 2.02 | 2.06 | |
| | 2.10 | 2.10 | | | 2.04 | | | | | | 2.14 (2.09) | 2.13 | | | | | | | | 2.05 (2.02) | 2.02 | | | | |
| $m_d$ | 0.88 (1) | | | −0.01 (0) | | | 1.87 (2) | | | 2.86 (3) | 3.72 (4) | | | 4.14 (5) | | | 0.03 (0) | −0.04 (0) | | 0.88 (1) | | | 1.59 (2) | | |

FIG. 7

| Hexagonal cell |
|---|
| | Ti | Ti$^{4+}$ | V | Cr | Mn | Fe | Co | Ni | Ni$^{2+}$ |
|---|---|---|---|---|---|---|---|---|---|
| $E_0$ | 112 | 92 | 75 | 120 | 90 | 90 | 90 | 11 | −13 |
| $E_1$ | 97 | 40 | 84 | | 107 | 151 | 90 | 97 | 110 |
| $E_2$ | 123 | | 120 | | 92 | 117 | 83 | 122 | 72 |

| Mixed cell |
|---|
| | Ti | Ti$^{4+}$ | V | Cr | Mn | Fe | Co | Ni | Ni$^{2+}$ |
|---|---|---|---|---|---|---|---|---|---|
| $E_0$ | 108 | 99 | 74 | 121 | 89 | 92 | 122 | −10 | −5 |
| $E_1$ | 87 | | 72 | | 102 | 166 | 122 | 138 | 128 |
| $E_2$ | 186, 97, 104 | 93, 95, 86 | 120 | | 122, 105, 108 | 124 | 103 | 69, 94, 105 | 94 |

FIG. 8

| Anion | O | | N (AFM) | | N (GS) | | N³⁻ | | N¹⁻ | | B | | B³⁻ | | B¹⁻ | |
|---|---|---|---|---|---|---|---|---|---|---|---|---|---|---|---|---|
| Cell | Bulk | | Hex | Mix | Hex | Mix | Hex | Mix | Hex | Mix | Hex | Mix | Hex | Mix | Hex | Mix |
| $d_1$ | 1.96 | | 1.98 | 1.97 | 1.86 | 1.86 | 1.93 | 1.94 | 2.08 | 2.06 | 1.92 | 1.90 | 1.97 | 1.95 | 2.02 | 1.98 |
| $d_2$ | 1.96 | | 1.80 | 1.81 | 1.89 | 1.88 | 1.93 | 1.94 | 1.68 | 1.69 | 2.10 | 2.09 | 1.97 | 1.95 | 2.02 | 1.98 |
| $d_3$ | 2.01 | | 2.11 | 2.11 | 2.13 | 2.13 | 1.97 | 1.98 | 2.13 | 2.14 | 2.11 | 2.08 | 2.16 | 2.16 | 2.20 | 2.20 |
| $d_4$ | 2.01 | | 1.99 | 1.98 | 1.98 | 1.98 | 1.97 | 1.98 | 2.04 | 2.10 | 2.19 | 2.24 | 2.16 | 2.16 | 2.20 | 2.20 |

FIG. 9

| Anion | N (AFM) | | N (GS) | | N³⁻ | | N¹⁻ | | B | | B³⁻ | | B¹⁻ | |
|---|---|---|---|---|---|---|---|---|---|---|---|---|---|---|
| Cell | Hex | Mix | Hex | Mix | Hex | Mix | Hex | Mix | Hex | Mix | Hex | Mix | Hex | Mix |
| $E_1$ | −76 | −111 | 385 (184) | 374 (202) | 111 | 98 | 48 | −13 | 386 (344) | 504 (361) | 130 (31) | 185 (51) | 314 | 431 (334) |
| $E_2$ | −6 | 11 | 597 (427) | 577 (388) | 111 | 98 | 14 | −42 | 195 (108) | 323 (242) | 130 (31) | 185 (51) | 314 | 431 (334) |
| $E_3$ | 146 | 166 | 147 (131) | 170 (159) | 129 | 107 | 59 | 84 | 387 (320) | 422 (352) | 457 (276) | 473 (230) | 288 | 290 (216) |
| $E_4$ | 242 | 231 | 158 (70) | 247 (145) | 129 | 107 | 240 | 189 | 332 (251) | 276 (224) | 457 (276) | 473 (230) | 288 | 290 (216) |

MAGNETOELECTRIC CHROMIA HAVING INCREASED CRITICAL TEMPERATURE

CROSS REFERENCE TO RELATED APPLICATION

This application claims the benefit of U.S. Provisional Application Ser. No. 61/943,528, filed Feb. 24, 2014, which is hereby incorporated by reference in its entirety, including all figures, tables and drawings.

This invention was made with government support under Contract No. NSF/MRSEC DMR-0820521 awarded by NSF. The government has certain rights in the invention.

BACKGROUND

Magnetoelectric antiferromagnets have attracted considerable attention due to their possible applications in magnetoelectronic devices utilizing electric control of magnetization. These materials provide a functional alternative to multiferroics for such applications as nonvolatile magnetoelectric memory.

Bulk chromia ($Cr_2O_3$) has the highest Néel temperature ($T_N=307$ K) among the well-characterized magnetoelectric antiferromagnets, which allows for room-temperature operation in temperature-controlled conditions. However, this critical temperature still does not provide enough flexibility for practical applications. Above the 307 K ordering temperature, time inversion symmetry is reestablished and the linear magnetoelectric effect is ruled out by symmetry constraints. In order to tune the magnetoelectric properties of chromia towards the requirements of room temperature spintronic applications, its Néel temperature in thin films needs to be significantly increased relative to $T_N=307$ K of bulk chromia.

BRIEF SUMMARY

A magnetoelectric material is presented that exhibits above-room-temperature operation. In particular, a boron-doped chromia is described that displays a magnetoelectric character at higher temperatures than typically available from chromia alone.

The increased critical temperature (Néel temperature) for the chromia and boron alloy facilitates wide spread use and flexibility for practical applications. The described boron-doped chromia is suitable for voltage controlled switching in magnetoelectronic devices such as magnetic tunnel junction structures and spin field effect transistors. The described boron-doped chromia is also suitable for voltage-controlled switching of catalysts.

A composition comprising chromia and boron can be fabricated by depositing chromia in the presence of borane. For example, the boron-doped chromia can be fabricated by including borane in a deposition chamber during a pulsed laser deposition process for chromia.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 2A and 2B show example boranes that may be used to fabricate the described boron doped chromia.

FIGS. 3A-3C illustrate representative applications of the described boron-doped chromia.

FIGS. 13A and 13B illustrate isosurfaces of the charge density (0.034 e/Å$^3$) for the shallow impurity states shown by arrows in panel (a) of FIG. 11. FIG. 13A illustrates majority spin; and FIG. 13B illustrates minority spin.

FIGS. 14A and 14B show the DOS for the charged B impurities in $Cr_2O_3$. FIG. 14A shows the $B^{3-}$ state; and FIG. 14B shows the $B^{1-}$ state.

DETAILED DESCRIPTION

A magnetoelectric material is presented that exhibits above-room-temperature operation. In particular, a boron-doped chromia is described that displays a magnetoelectric character at higher temperatures than typically available from chromia alone. Advantageously, the inclusion of boron increases the critical temperature ($T_N$) of $Cr_2O_3$ while also maintaining a stable chromia interface, both top and bottom.

Implementations of the boron-doped chromia can include boron doping percentages of 1% to 10% in place of the oxygen in the chromia; the maximum percentage may be limited by the ability of the alloy to substitute the B atoms for the O atoms without undue precipitation during fabrication. As the percentage of boron substitution increases, so does the critical temperature. In many cases, the percentage doping of boron for the described boron-doped chromia is an amount sufficient to achieve a critical temperature of at least 400 K.

It is theorized that each B atom substituted for O (in the 2– or 1– charge state) in magnetoelectric chromia ($Cr_2O_3$) enhances the exchange energy on its four Cr neighbors by a factor of 2 to 3. This means that TN can increase at the rate of 5%-10% per 1% of boron substitution. Experimental results show that inclusion of 3% boron in chromia increases the critical temperature to roughly 420 K, which is an increase of about 30-35% from the 307 K of undoped chromia. This increase corresponds to about 10% per 1% of boron substitution, which agrees with the theoretical estimates.

Not only does the boron increase the critical temperature, but the boron-doped chromia also maintains magnetoelectric properties. In particular, the boron doped chromia shows boundary polarization when field cooled, and the polarization reverses when the electric field is reversed establishing this chromia as a magnetoelectric like undoped chromia.

A magnetoelectric material having an increased critical temperature can be fabricated by forming a magnetoelectric comprising chromia and boron. A composition of chromia with boron included can be fabricated by depositing chromia in the presence of borane.

In one implementation, the boron-doped chromia is be fabricated by including borane in a deposition chamber during a pulsed laser deposition process for chromia. The borane vapor can be any suitable borane and may include more than one structure type. In certain implementations, nido structure type borane such as decaborane and/or pentaborane (and/or diborane) is used.

Figure 1A:
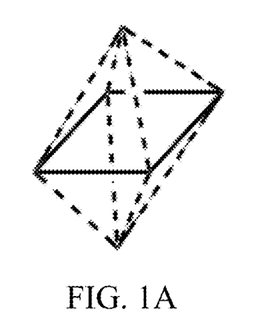
FIGS. 1A-1C illustrate the three structure categories of closo, nido, and arachno.
Figure 1B:
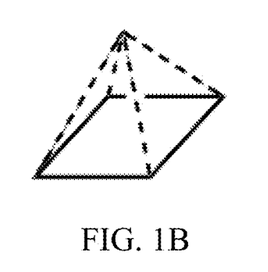
Figure 1C:
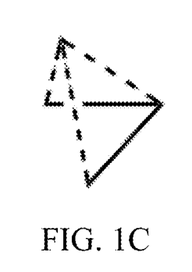

Boranes are compounds composed of boron and hydrogen (and sometimes a cation) and may be neutral or anionic. The three general categories of structural types for the various boranes are: closo ("closed"), nido ("nest"), and arachno ("spider's web"). FIGS. 1A-1C illustrate the three structure categories of closo, nido, and arachno. The structure category of closo refers to the most symmetrical possible arrangement, a closed polyhedron (e.g. 6 B atoms form an octahedron as illustrated in FIG. 1A). The structure category of nido comes from the next higher closo-polyhedron with the most highly connected boron vertex removed (e.g. for 5 B atoms, an octahedron less any one vertex to yield a square pyramid such as shown in FIG. 1B). Arachno comes from the next higher nido-structure with the most highly connected boron vertex on the open face removed (e.g. for 4 B atoms, a square pyramid less any basal vertex to yield a butterfly structure such as shown in FIG. 1C).

The prefix and corresponding general formula (and valence electron-based relationships where n is the number of boron atoms in a cluster) are given for each of these three structures as follows:

closo—$B_nH_n^{2-}$—$4n+2$ valence electrons     a)

nido—$B_nH_{n+4}$—$4n+4$ valence electrons     b)

arachno—$B_nH_{n+6}$—$4n+6$ valence electrons     c)

Figure 2A:
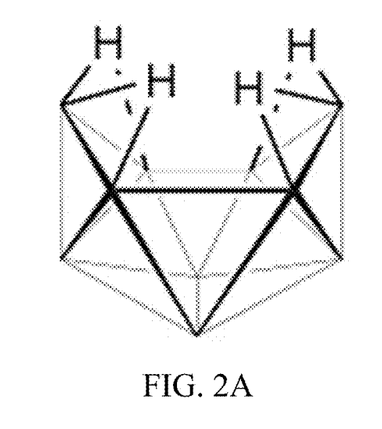
FIG. 2A shows the structure of nido-decaborane ($B_{10}H_{14}$)
Figure 2B:
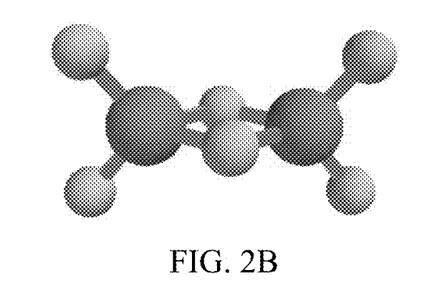
FIG. 2B shows the structure of diborane ($B_2H_6$), common gaseous boron source compound.

FIGS. 2A and 2B show example boranes that may be used to fabricate the described boron doped chromia. FIG. 2A shows the structure of nido-decaborane ($B_{10}H_{14}$); and FIG. 2B shows the structure of diborane ($B_2H_6$). The air sensitivity of boranes decreases with increasing size so higher boranes tend to be easier to work with. Thus, decaborane can, in some cases, be easier to use than diborane or pentaborane ($B_5H_{11}$).

As mentioned above, certain implementations may use one or more of diborane, pentaborane, and decaborane as the borane vapor during formation of a chromia layer to form the boron-doped chromia.

In order to implement writing of magnetic bits at ultralow power, the search for voltage-controlled switching of magnetic state variables, which does not rely on electric currents, has intensified. In this regard, voltage-controlled exchange bias is particularly promising. Exchange bias occurs because of exchange interaction at the interface of adjacent ferromagnetic and antiferromagnetic thin films creating unidirectional anisotropy in the ferromagnetic layer. Exchange bias shifts the ferromagnetic hysteresis loop along the magnetic field axis by an amount known as the exchange bias-field.

Magnetoelectric antiferromagnets, such as $Cr_2O_3$ and $Fe_2TeO_6$, allow for isothermal voltage-control of the antiferromagnetic interface magnetization. $Cr_2O_3$-based exchange bias systems are perhaps the most promising pathway to voltage-control of exchange bias at room temperature when allowing for the presence of a small symmetry breaking static magnetic field during the electric switching of the antiferromagnetic order parameter. In an exchange bias system, antiferromagnetic interface magnetization couples via exchange with the adjacent ferromagnet to give rise to the exchange bias effect. In magnetoelectric antiferromagnets, however, this interface magnetization (boundary magnetization) has a unique origin and distinctive properties with important consequences for voltage-control of exchange bias. Roughness insensitive boundary magnetization emerges at surfaces or interfaces of a single domain magnetoelectric antiferromagnet. This phenomenon originates from the symmetry conditions associated with magnetoelectricity and gives rise to an intimate coupling between the boundary magnetization and the antiferromagnetic order parameter. In chromia the antiferromagnetic order parameter can be switched by an electric field in the presence of a simultaneously applied magnetic field. The reversal of the antiferromagnetic order parameter is accompanied by reversal of the boundary magnetization which causes the exchange bias field of the ferromagnetic film to switch.

Figure 3A:
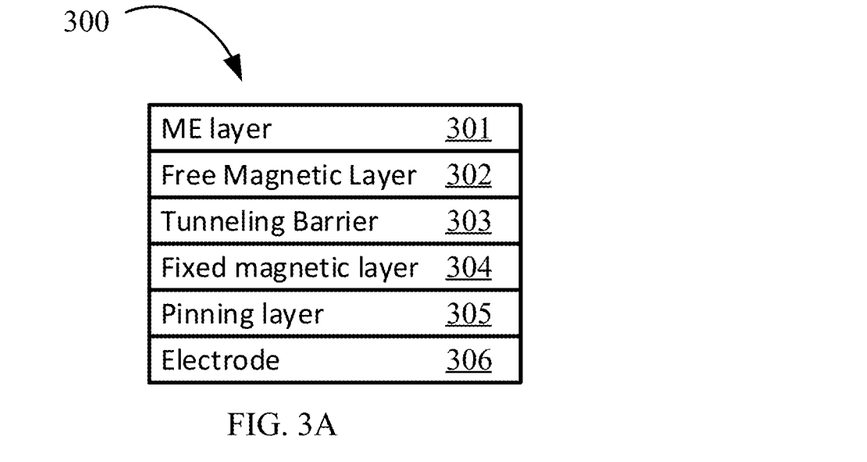
FIG. 3A illustrates a magnetic tunnel junction structure.
Figure 3B:
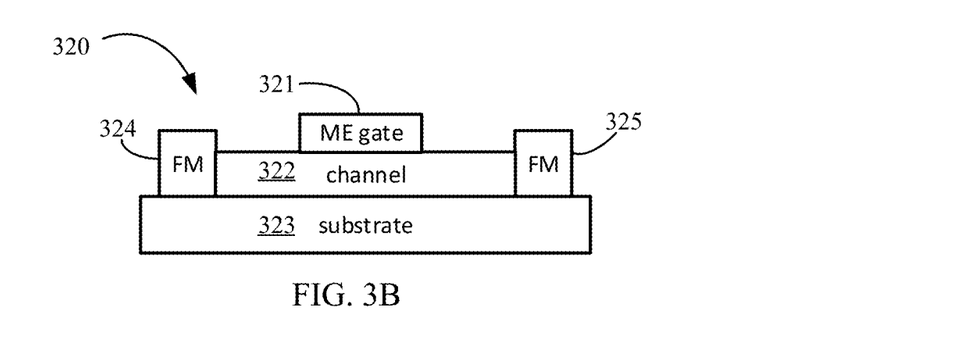
FIG. 3B illustrates a spin field effect transistor.
Figure 3C:
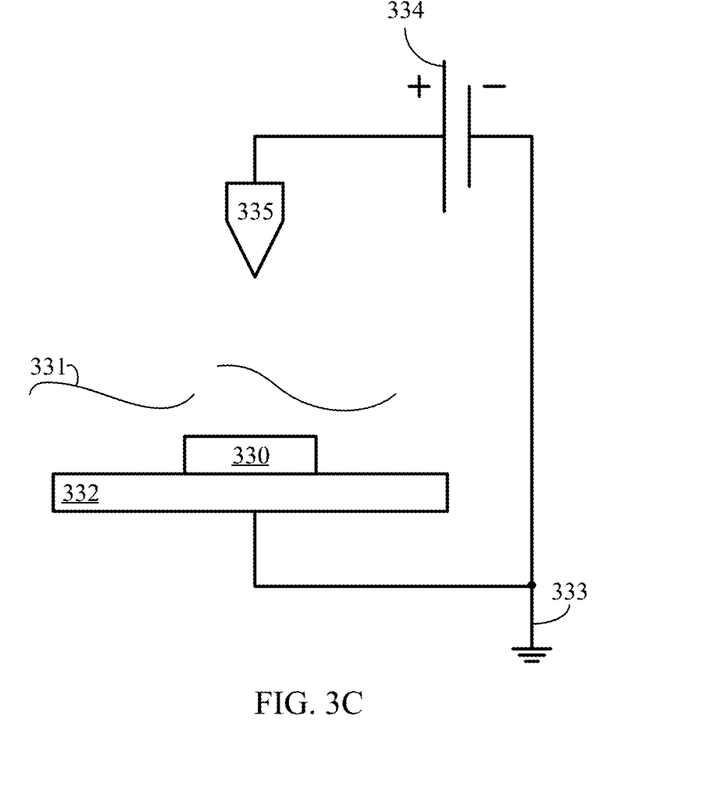
FIG. 3C illustrates a voltage-controlled catalyst configuration.

Advantageously, the chromia and boron alloy enables a more robust material (and thus devices) so that operation can be carried out above room temperature. Certain implementations of the described magnetoelectric material are suitable for magnetic tunnel junction structures, spin field effect transistors, and even voltage switchable catalysts. FIGS. 3A-3C illustrate representative applications of the described boron-doped chromia. FIG. 3A illustrates a magnetic tunnel junction structure; FIG. 3B illustrates a spin field effect transistor (FET); and FIG. 3C illustrates a voltage-controlled catalyst configuration.

As illustrated in FIG. 3A, a magnetic tunnel junction structure 300 can include a stack of a magnetoelectric (ME) layer 301, a free ferromagnetic (FM) layer 302, a tunneling barrier 303, a fixed FM layer 304, a pinning layer 305 (e.g., an antiferromagnetic layer), and a bottom electrode 306. Here, the ME layer 301 can be implemented using the described boron doped chromia.

As illustrated in FIG. 3B, a spin-FET 320 can include a ME gate 321 on a conductive layer or semiconductor material providing a channel 322 on a substrate 323. FM layers can provide the source 324 and drain 325. Here, the ME gate 321 can be implemented using the described boron doped chromia.

As illustrated in FIG. 3C, a catalytically active magnetoelectric 330 can provide different spin states at its interface, changing reaction rates where local spin matter in the catalytic barrier. Typical catalytically responsive reaction gases 331, such as $CO+H_2O \leftrightarrows CO_2+H_2$ or $CH_3OH$, are passed over the surface of the catalytically active magnetoelectric 330 on a sample holder 332, which is connected to ground 333. A high voltage source 334 is applied at a tip 335 to cause the magnetoelectric 330 to switch. Through illumination of the chromia surface or other catalytically active magnetoelectric 330, enhanced photocatalysis may also be accomplished, where one circular polarization of light is favored over the other (e.g., left or right versus the other) in one particular domain state. As with the other examples, the magnetoelectric 330 can be implemented using the described boron doped chromia. This latter boron inclusion is advantageous as the operational photocatalytic temperatures are much higher, the higher the Néel temperature.

A greater understanding of certain implementations of the present invention and of their various advantages may be had from the following illustrative examples.

EXAMPLE 1

Pulsed Laser Deposition

Boron doped chromia ($Cr_2B_xO_{3-}$) thin films with substitutional doping levels between zero and 3% were grown using pulsed laser deposition in borane background gases.

The boron doping was achieved by including decaborane ($B_{10}H_{14}$) vapor in the deposition chamber during the pulsed laser deposition. However, other boranes may be suitable as well. For example, pentaborane ($B_5H_9$) or diborane may be used to form the chromia and boron alloy.

Here, pulsed laser deposition of $Cr_2O_3$ from a chromia target in the presence of $B_{10}H_{14}$ background atmosphere leads to substitution of $O^{2-}$ ions by boron and thus $Cr_2B_xO_{3-}$ alloys. A KrF excimer laser with pulse energies of 200 mJ and pulse width of 20 ns was used at a repetition rate of 10 Hz to create a plume from a chromia target allowing to deposit (0001) textured chromia thin films on cleaned sapphire (0001) substrates. The substrates were kept at 700° C. during deposition and are located ~8.5 cm from the target. Deposition took place in the decaborane ($B_{10}H_{14}$) vapor background of various partial pressures between $\sim 7.5 \times 10^{-8}$ to $1.0 \times 10^{-6}$ mbar resulting in doping levels between $x \approx 0$ and approximately 3%, as determined from core level photoemission.

Magnetometry revealed a tunable increase in the Néel temperature of the (0001) textured $Cr_2B_xO_{3-}$ thin films at a rate of about 10% with 1% oxygen site substitution preserving a net boundary magnetization. Spin resolved inverse photoemission measured after magnetoelectric annealing in subsequently reversed electric fields evidences voltage-controlled reversal of boundary magnetization and thus magnetoelectricity of $Cr_2B_xO_{3-}$. Conservation of magnetoelectricity far above room temperature makes ultra-low power voltage-controlled spintronic devices feasible.

In particular, the structural and electromagnetic characterization of the fabricated films are illustrated in FIGS. 4A, 4B, 5, 6A, and 6B.

Figure 4A:
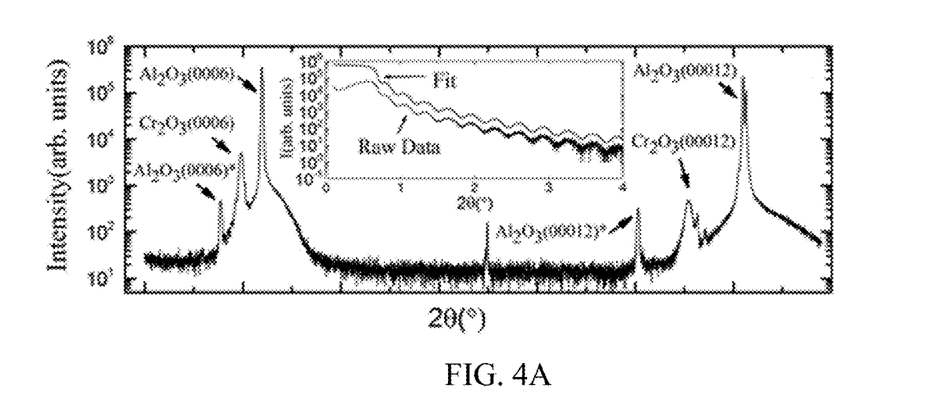
FIGS. 4A and 4B show plots of wide and small angle x-ray diffraction of pure (FIG. 4A) and B-doped (FIG. 4B) chromia thin films.
Figure 4B:
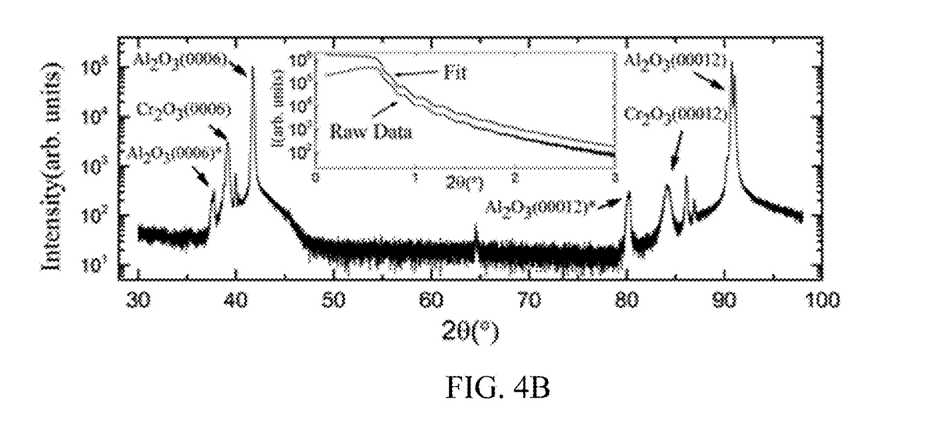

FIGS. 4A and 4B show plots of wide and small angle x-ray diffraction of pure (FIG. 4A) and B-doped (FIG. 4B) chromia thin films. A wide angle θ-2θ x-ray diffraction pattern can be seen in the main portion of the Figures, while the insets show the respective small angle x-ray diffraction image. Narrow (0006) and (00012) $K_n$ peaks indicate (0001) textured chromia. (*) indicates $K_\beta$ peaks. Inset of FIG. 4A shows small angle x-ray diffraction raw data and best fit (shifted for clarity relative to raw data) determining a film thickness of 26.3 nm and roughness of 0.22 nm. FIG. 4B and inset show the corresponding data for 3% B-doped chromia thin film. Fit of x-ray small angle diffraction data reveals a film thickness of 35.5 nm with roughness of 0.26 nm.

Figure 5:
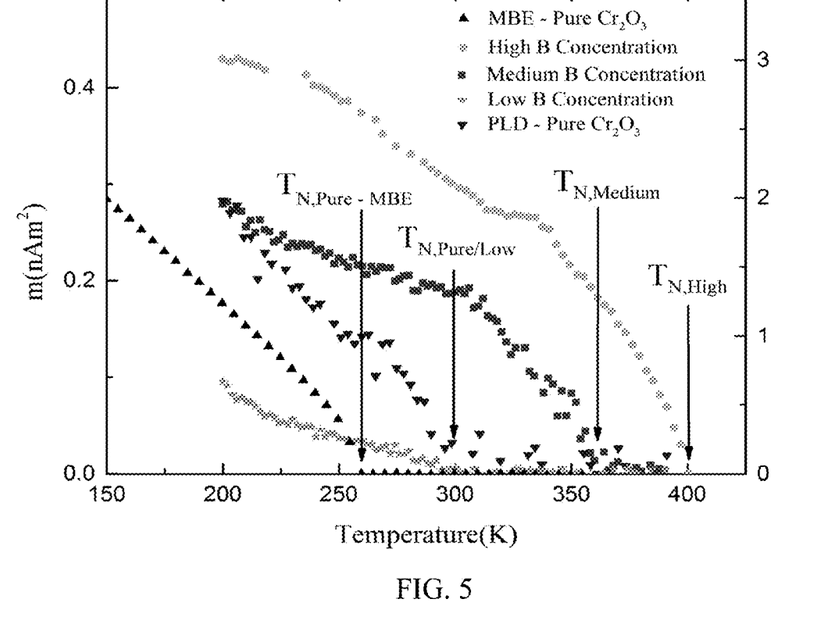
FIG. 5 shows a plot of magnetic moment, m, versus temperature measured on heating in zero applied field comparing PLD grown films of pure chromia (down triangles) and B concentrations from <1% (stars) to ~2% (squares) to ~3% (circles), as well as a reference pure chromia film of 100 nm thickness grown by molecular beam epitaxy (up triangles).

FIG. 5 shows a plot of magnetic moment, m, versus temperature measured on heating in zero applied field comparing PLD grown films of pure chromia (down triangles) and B concentrations from <1% (stars) to ~2% (squares) to ~3% (circles), as well as a reference pure chromia film of 100 nm thickness grown by molecular beam epitaxy (up triangles). In FIG. 5, the temperature dependence of the remnant magnetic moment, m, of all investigated samples can be seen, reflecting the boundary magnetization of pure and B-doped chromia films. The m vs. T data have been measured with a superconducting interference device (SQUID) on zero field heating after field-cooling the films in a magnetic field of 7 T applied normal to the films. True zero-field conditions have been maintained on heating through quenching of the superconducting coils, thus eliminating residual trapped magnetic flux.

In the case of thin films, magnetic field-cooling suffices to select a preferential orientation of the boundary magnetization in the direction of the applied field. The preferential selection of boundary magnetization is accompanied and stabilized by preferential selection of one of the two degenerate 180 degree antiferromagnetic single domain states. Because the remnant boundary magnetization is intimately coupled with the antiferromagnetic order parameter, the temperature T* defined by m(T>T*)=0 unambiguously determines the Néel temperature, TN, of the film.

In accordance with the theoretical prediction (discussed in more detail in the Example 2 below), an increase in $T_N$ occurs with increasing B-concentration from $T_N(x=0) \approx 307$ K to $T_N(x \approx 0.03) \approx 400$ K. For reference purposes, the data is measured from a sample of 28 nm thickness grown by molecular beam epitaxy. Note that in thin films $T_N(x=0)$ <307 K is commonly observed (see up-triangle in FIG. 5). Here, finite size effects and defects such as potential oxygen vacancies can reduce the Néel temperature substantially to below the bulk value. This highlights the challenge and achievement associated with increasing the Néel temperature in thin films to values such as $T_N$ ($x \approx 0.03) \approx 400$ K via B-doping.

The various undoped and B-doped PLD grown chromia thin films had also been investigated by spin-polarized inverse photoemission experiments. The inverse photoemission experiments were performed to determine whether the B-doped films possess boundary magnetization and whether this boundary magnetization can be switched via voltage-control, a necessary prerequisite for their use in potential room temperature spintronic applications.

The magnetoelectric cooling was accomplished in applied axial magnetic and electric fields with magnitudes in excess of 40 mT and 1400 V, respectively. The Fermi level was established from tantalum and gold foils in electrical contact with the sample. The outcome of the experiments show that 3% doped samples provide very significant spin polarization asymmetries at room temperature, compared to undoped chromia.

Figure 6A:
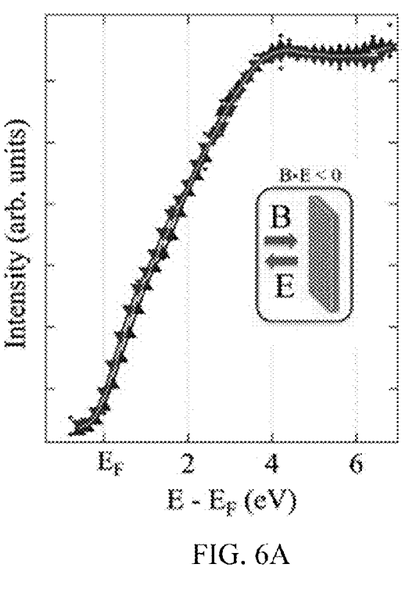
FIGS. 6A and 6B show plots of the spin polarized inverse photoemission spectra of B-doped chromia thin films with doping concentration <1% (FIG. 6A) and a B-doped chromia of about 3% (FIG. 6B).
Figure 6B:
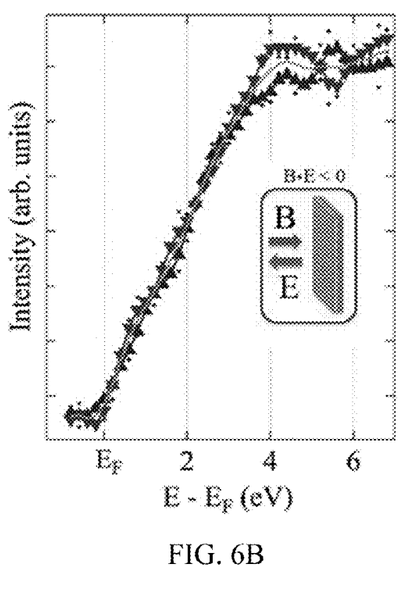

FIGS. 6A and 6B show plots of the spin polarized inverse photoemission spectra of B-doped chromia thin films with doping concentration <1% (FIG. 6A) and a B-doped chromia of about 3% (FIG. 6B).

The photoemission spectra were taken at 295 K after field cooling with B*E<0. Data are shown for boron substitution concentrations less than 1% (FIG. 6A) and approximately 3% (FIG. 6B), as determined from XPS core level intensities. Spin majority—spin up state, and spin minority—spin down state, components are indicated by upward triangles and downword triangles, respectively, as a smoothed spectra result. The lines represent the respective average inverse photoemission signal.

As shown in FIG. 6A, the spectrum of low B-doped samples measured at T=295 K shows no appreciable spin polarization, similar to undoped chromia. However, as shown in FIG. 6B, the spin resolved inverse photoemission spectra of the $Cr_2B_{0.03}O_{2.97}$ sample has significant spin polarization at room temperature. Electric field switching was demonstrated together with control experiments in non-spin-mode over several samples. A key result is that the boundary magnetization is seen to reverse when the electric field is reversed during field cooling to T=295 K. It confirms a magnetoelectric origin to this boundary magnetization together with the fact that sizable boundary magnetization is present at T=295 K. The spectra of the doped samples are in contrast to the spectra of the undoped samples where the antiferromagnetic order parameter and the boundary magnetization are too low at T=295 K to allow resolving voltage-controlled switching via inverse photoemission.

The photoemission data are thus consistent with the data from SQUID magnetometry shown in FIG. 5 and moreover confirm that B-doped samples with increased Néel temperature have voltage-controllable boundary magnetization. The less the boron content, the less pronounced is the in-plane spin asymmetry at room temperature. This can be interpreted as an increase of the Néel temperature with increasing B-concentration in accordance with the results from magnetometry.

As illustrated by the measurements taken of the fabricated examples, B-doping of the magnetoelectric antiferromagnet chromia is an efficient way to increase the Néel temperature. The experimental findings obtained by SQUID magnetometry and spin polarized inverse photoemission spectroscopy are in good agreement with first principle investigations predicting an increase of the Néel temperature by approximately 10% per 1% substitution of oxygen by boron (see also Example 2 below). The magnetometry data revealed an increase of the critical temperature of chromia from its bulk value of 307 K to 400 K by approximately 3% boron doping.

The findings indicate that chromia and potentially other magnetoelectric antiferromagnets can be successfully used in ultra-low power, voltage-controlled spintronic applications as well as other voltage-controlled switching structures. It should be noted that due to boron's small atomic radius, B-diffusion may occur after repeated heat treatment. In addition, it is still an open question whether B only occupies oxygen positions in the lattice. The core level shifts observed from x-ray spectroscopy seem to indicate that this is indeed the case in the bulk, but imply that chromium positions at the surface can also be occupied by boron.

EXAMPLE 2

Theoretical Effect of Substitutional Doping

The effect of substitutional doping on the Néel temperature of $Cr_2O_3$ was explored. In particular, first-principles calculations were used to explore the possibility of enhancing the Néel temperature TN of the magnetoelectric antiferromagnet $Cr_2O_3$ by substitutional doping. A number of transition metal (V, Ti, Mn, Fe, Co, and Ni) and anion (N and B) impurities were evaluated for their effect on the exchange interaction. Although transition-metal impurities and N are likely to reduce $T_N$, it was discovered that substitution of O by B is likely to increase $T_N$. Both N and B impurities introduce impurity states mediating strong hybridization and magnetic interaction between the neighboring Cr ions. For N impurities, this leads to magnetic frustration, but in the case of B substitution, surprisingly the stability of the ground antiferromagnetic state is enhanced.

It was determined that a sizable and tunable $T_N$ increase of chromia films can be accomplished via substitutional anion doping. This may be done instead of or in addition to using strain to increase the critical temperature of chromia. By substituting boron for oxygen, the exchange energies can be increased between Cr spins and thus the antiferromagnetic ordering temperature can be increased. The calculations show that substitutional boron doping of $Cr_2O_3$ can increase $T_N$ by roughly 10% per 1% O site substitution with B.

An evaluation of a number of potential substitutional dopants, both on the cation and on the anion sites in $Cr_2O_3$ was conducted using electronic structure calculations based on the local-density approximation (LDA)+U method. This method provides a very good description of the structural, electronic, and magnetic properties of bulk $Cr_2O_3$, and it has been used to characterize transition-metal impurities in hematite. In order to assess the effect of the dopant on the Néel temperature, the effective exchange field experienced by the transition-metal dopant as well as by the nearby Cr atoms (for both transition-metal and anion dopants) was calculated as the energy difference between the ground state (GS) and the state in which the local moment of the corresponding atom is reversed.

Based on the results, it was possible to predict that boron doping should increase $T_N$ of $Cr_2O_3$ by approximately 10% per 1% of O site substitution by B. For the favorable midgap position of the Fermi level, the B impurity is expected to be in a neutral charged state with an excitation gap of about 2 eV.

To set-up the computations, the impurities were introduced using two kinds of super-cells (each containing 30 atoms). The first kind is the conventional hexagonal unit cell, which is often used for bulk $Cr_2O_3$. The second, "mixed" kind of cell was also considered in order to increase the in-plane separation between the impurities. This mixed cell was constructed by enlarging the in-plane hexagonal lattice vectors by $\sqrt{3}$ and taking one of the rhombohedral translations as the third translation vector. Comparison of the results obtained with different supercells enables the estimation of the degree to which the finite size of the cell affects the electronic and magnetic properties. In all calculations, one Cr or O atom in the cell was replaced by an impurity atom. The ionic coordinates were relaxed while keeping the cell shape and volume fixed at their equilibrium values for bulk $Cr_2O_3$.

The details of the electronic structure calculations were similar to those of S.-Q. Shi et al., Phys. Rev. B 79, 104404 (2009), including the use of the rotationally invariant LDA+U method with U=4 and J=0.58 eV. (The same values of U and J were employed for all transition-metal impurities.) The Kohn-Sham equations were solved using the projector augmented-wave method as implemented in the Vienna ab initio simulation package code. The plane-wave energy cutoff of 520 eV and Γ-centered Monkhorst-Pack grids were used for the Brillouin zone integration. Gaussian smearing of 0.1 eV (0.02 eV) and a 4×4×2 (8×8×4) k-point mesh were used for ionic relaxation [density of states (DOS) calculation] for the hexagonal cell. Similar parameters were employed for the mixed cell, except that the k-point mesh was 3×3×5. The Hellmann-Feynman forces were converged to 0.005 eV/Å.

First, a model for chromia was generated. It is understood that $Cr_2O_3$ crystallizes in the corundum structure (space group $R\bar{3}c$); and can be viewed as a stacking of buckled honeycomb Cr double layers along the (0001) direction with quasihexagonal close-packed O layers in between. Crystallographically, all Cr ions are equivalent. Each Cr has one nearest-neighbor Cr atom along the (0001) direction and three next-nearest-neighbor Cr atoms within the same honeycomb layer. Since the crystal field on the Cr site is approximately octahedral, it is customary to classify the Cr 3d electronic states into $t_{2g}$ and $e_g$ sub-bands (and thus reference to these sub-bands are used in this approximate sense even though the actual local symmetry at the Cr site is C3, and consequently, the $t_{2g}$ states are slightly split into a lower-lying doublet and a higher-lying singlet, and the $e_g$ states hybridize strongly with O 2p states).

The occupied Cr states are almost fully spin polarized. The top of the valence band is formed by majority-spin Cr $t_{2g}$ states separated by a small gap from the O 2p states; the latter are strongly hybridized with Cr $e_g$. The calculated fundamental band gap is 3.0 eV, which is close to the experimental 3.4 eV. At the bottom of the conduction band, there are majority-spin Cr $e_g$ states. The minority-spin Cr 3d states (both $t_{2g}$ and $e_g$) lie somewhat higher.

The local magnetic moment on Cr is $2.86\mu_B$, which is close to the ionic limit of $3\mu_B$. Magnetism can be well described by the Heisenberg Hamiltonian with strong exchange interactions with the first two shells of neighbors and additional weak interactions up to the fifth-neighbor shell. The exchange interaction in $Cr_2O_3$ is, to a large extent, controlled by direct-hopping Cr—Cr exchange, whereas, superexchange through O is ineffective.

It is desirable to find a way to achieve higher $T_N$ by suitable alloying. Indeed, the magnetic interaction in $Cr_2O_3$ appears to be controlled by direct Cr—Cr exchange, which is sensitive to the interatomic distances and can, therefore, be manipulated by atomic relaxations induced by dopants. Furthermore, impurity states introduced by a dopant can also provide additional exchange coupling between the Cr atoms of the host. On the other hand, in order to be usable as a switchable magnetoelectric device, the doped material should remain a good insulator. Therefore, the impurity states introduced by the dopant should not result in a narrow excitation gap.

Accordingly, in order to assess the effect of an impurity on the Néel temperature of $Cr_2O_3$, the exchange energies for the Cr neighbors of the impurity as well as for the cation impurities themselves were evaluated. The exchange energy for the given ion is defined as the energy separation between the magnetic ground state and the state in which the local moment on the given ion is reversed. (In the Heisenberg model, the exchange energy $E_i$ on site i is given by $E_i=2\Sigma_j J_{ij}$, where Jij is the Heisenberg model parameter; the local moments and their signs are here absorbed in the definition of the exchange energy.) For the homogeneous system with equivalent sites, the mean-field $T_N$ for the quantum spin-S Heisenberg model is equal to ⅙ of the exchange energy multiplied by (S+1)/S. The difference in the exchange energies at the impurity and at the nearby Cr atoms from Cr in the bulk can be used to evaluate the effect of that impurity on $T_N$. The calculation of the modification of $T_N$ was not attempted; rather, qualitative estimates were pursued.

Figure 7:
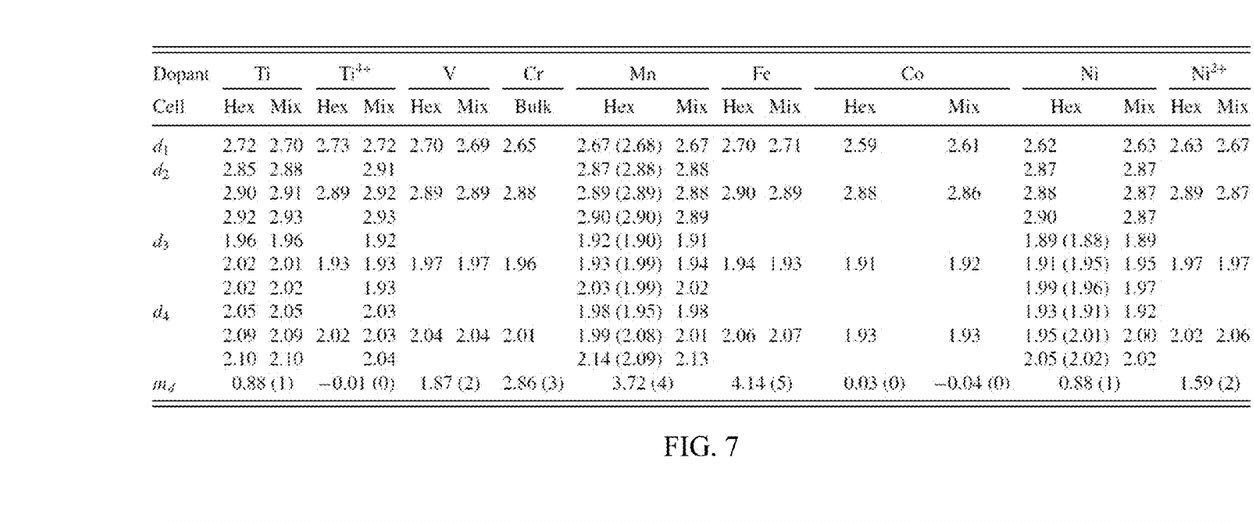
FIG. 7 shows Table I, which lists the distances from the dopant atoms of certain transition metal impurities to their Cr and O neighbors as well as the values of the local magnetic moment on the impurity atom.
Figure 8:
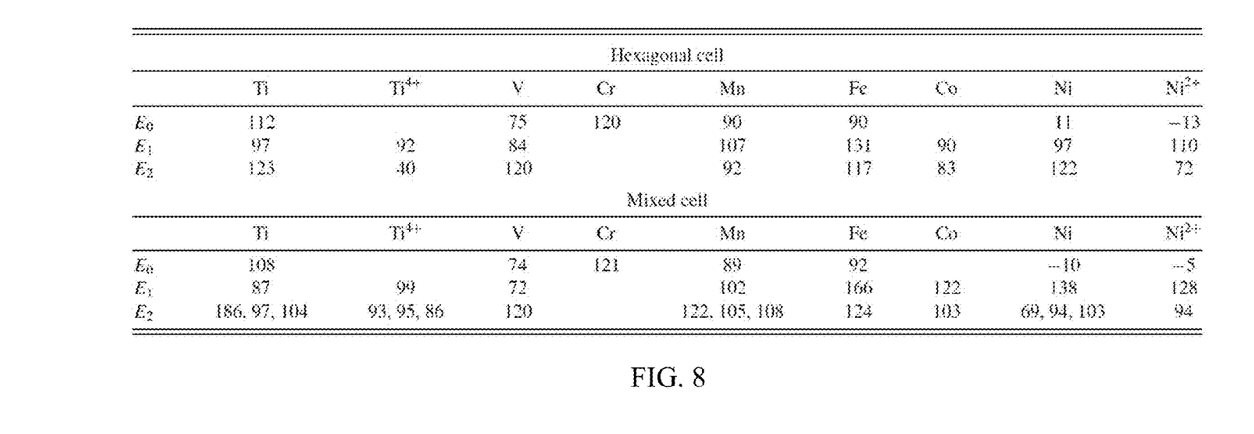
FIG. 8 shows Table II, which indicates the exchange energies for the dopants and for the nearby Cr atoms.

FIG. 7 shows Table I, which lists the distances from the dopant atoms of certain transition metal impurities to their Cr and O neighbors as well as the values of the local magnetic moment on the impurity atom. Although the mixed supercell breaks the $C_3$ symmetry of the Cr sites, the resulting differences in the bond lengths are in the mÅ range and are not seen in the table. Furthermore, exchange energies for the dopants and for the nearby Cr atoms are given in FIG. 8, providing Table II. Table II in FIG. 8 shows exchange energies (meV units) for transition-metal dopants ($E_0$) and for their nearest ($E_1$) and next-nearest ($E_2$) Cr neighbors in the hexagonal and mixed supercells. Referring to FIG. 7, Table I shows distances from the dopant ions to its nearest ($d_1$) and next-nearest ($d_2$) Cr neighbors and to its O neighbors in the nearest ($d_3$) and next-nearest ($d_4$) O layer (all in Å) as well as the local magnetic moment md ($\mu_B$) of the dopant ion (the local moment is given in brackets). Different values of the three second-neighbor distances indicate the presence of a Jahn-Teller distortion. The corresponding values are given for both hexagonal and mixed cells. The impurities are isovalent unless the formal ionic charge is specified.

The interatomic distances listed in Table I are quite similar for the hexagonal and mixed supercells when no Jahn-Teller distortion is present. The variation in the distances between the impurity and its neighbors can be understood as follows. Generally, as the nuclear charge is increased, the spatial extent of the 3d wave function is reduced, and the interatomic distances systematically contract. This general trend is seen in Table I with the notable exceptions of Mn, Fe, and Ni. For each of these dopants, the extra (relative to the preceding element) electron occupies an $e_g$-like impurity level; the latter are, in fact, antibonding hybrids of the dopant $e_g$ and oxygen 2p orbitals. Occupation of these orbitals weakens the bonding with the neighboring oxygen atoms, which, thereby, shift outward. As a result, the general trend of decreasing bond lengths is violated. This explanation is consistent with the fact that the largest bond-length reduction occurs between Fe and Co where two $e_g$-like orbitals are depopulated.

The charged states corresponding to the $Ti^{4+}$ and $Ni^{2+}$ ions do not have degenerate ground states and are, therefore, not Jahn-Teller active. Indeed, for the $Ni^{2+}$ ion as well as for $Ti^{4+}$ in the hexagonal cell, the symmetry of the impurity site is not broken (see Table I). However, in the mixed cell, the $Ti^{4+}$ ion with an empty 3d shell develops a small displacement from the symmetric position. This distortion is probably caused by the pseudo-Jahn-Teller effect and is driven by the hybridization between Ti and the neighboring oxygens. Due to the fact that the 3d shell of the $Ti^{4+}$ ion is empty, the displacement can lead to substantial energy gain from this hybridization, which competes with the elastic energy cost. This energy balance is apparently rather delicate since the presence of distortion depends on the choice of the supercell.

As can be seen from review of the transition metals and the results shown in the Table II of FIG. 8, none of the transition metal impurities are expected to increase $T_N$ in $Cr_2O_3$.

Figure 9:
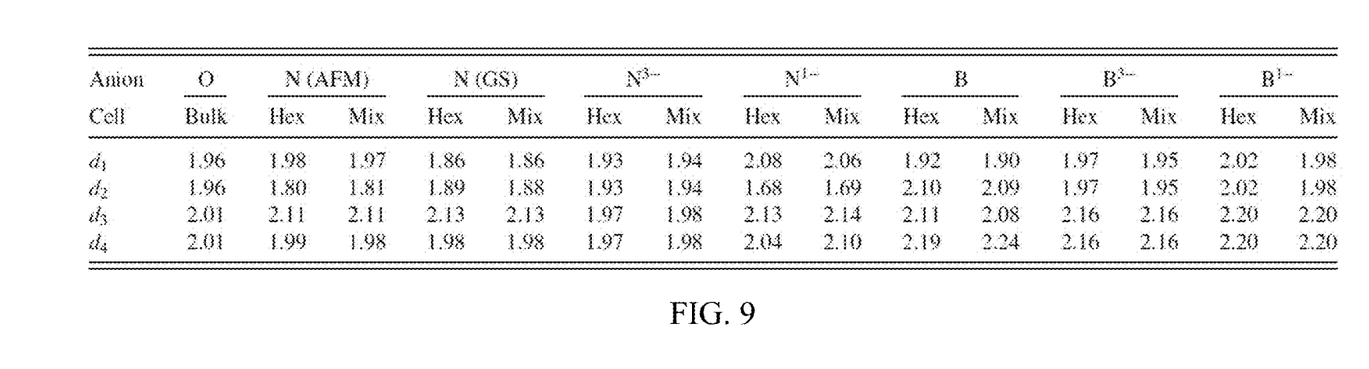
FIG. 9 shows Table III, which lists the bond lengths between the N or B ion (in different charge states) and its four Cr neighbors.

FIG. 9 shows Table III, which lists the bond lengths between the N or B ion (and charged N ions) and its four Cr neighbors. In bulk $Cr_2O_3$, each O atom has two pairs of equivalent bonds with Cr. For the N dopant, however, all four bonds become inequivalent. This structural distortion is a special kind of Jahn-Teller effect facilitated by antiferromagnetic ordering. The exchange energies for the four Cr neighbors of N are given in FIG. 10, which provides Table IV (presenting the exchange energies for the Cr atoms neighboring to the N and B dopants). By default, the energy differences are calculated at fixed structures, but fully relaxed energies are included in brackets where available. Through review of the results, it can be seen that N also is not expected to increase the $T_N$ in $Cr_2O_3$. However, analysis of B impurity effects provide a different outcome.

Figure 11:
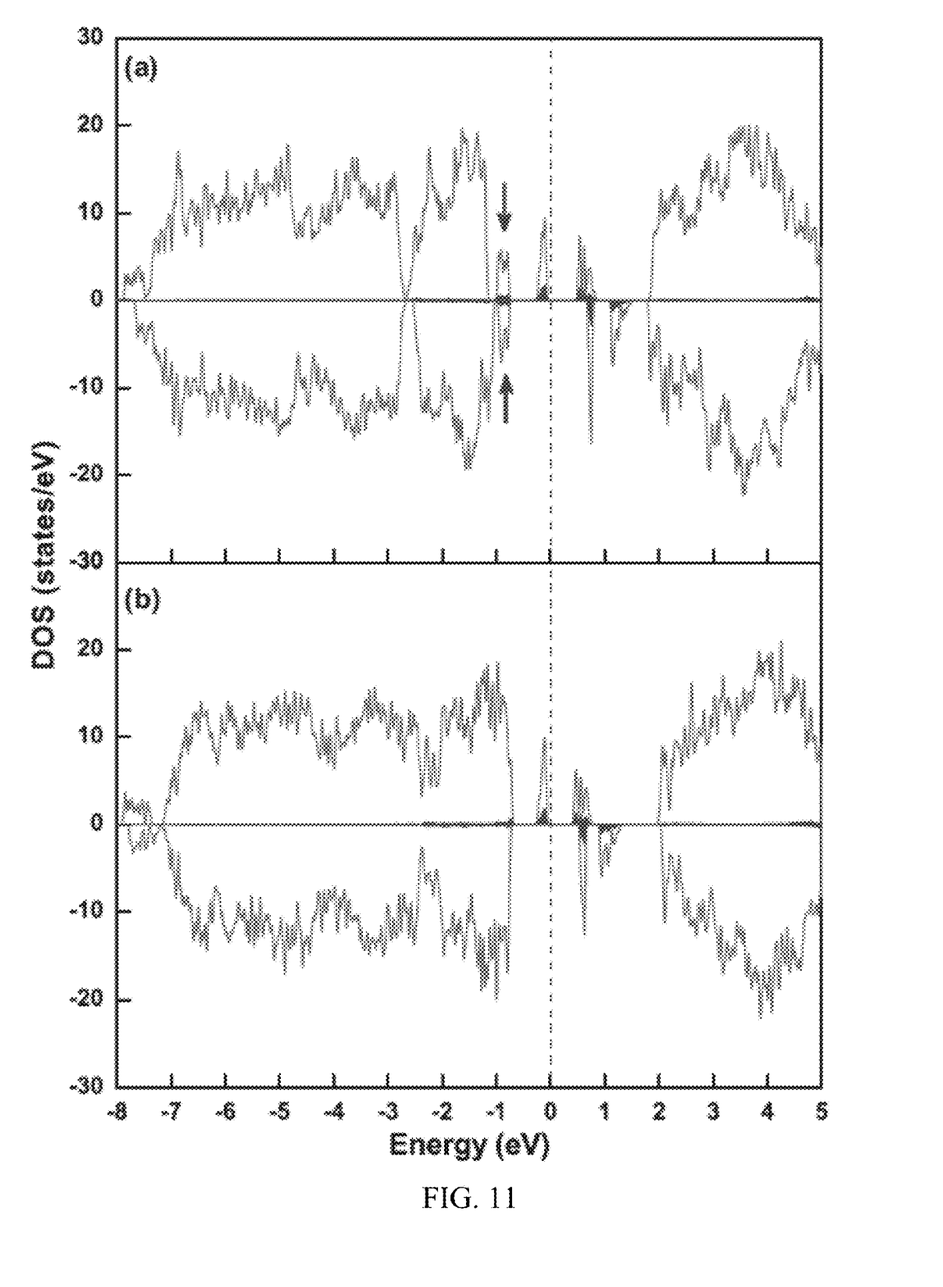
FIG. 11 shows the density of states (DOS) for B impurity in $Cr_2O_3$ with the actual number of electrons (panel (a)) and in the Slater transition state with ½ of an electron removed (panel (b)).
Figure 12:
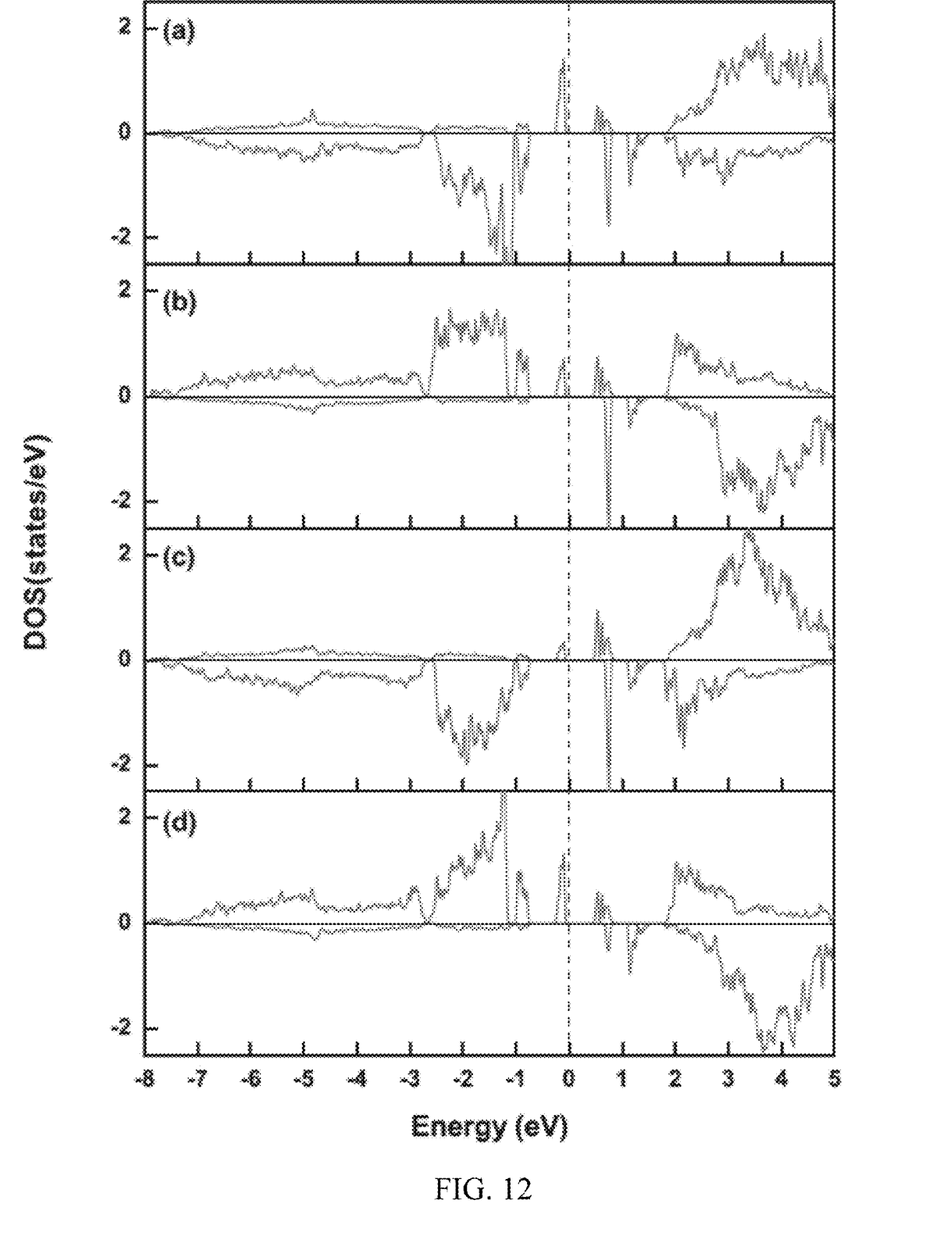
FIG. 12 shows the partial DOS on the Cr neighbors of the B impurity, where panels a, b, c, and d correspond to the Cr atoms in the order of Table III shown in FIG. 9.
Figure 13A:
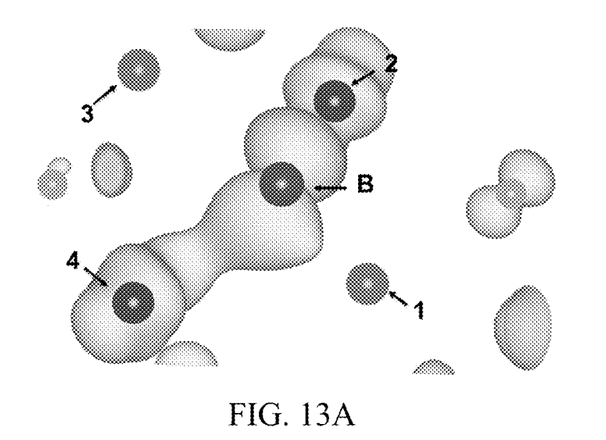
Figure 13B:
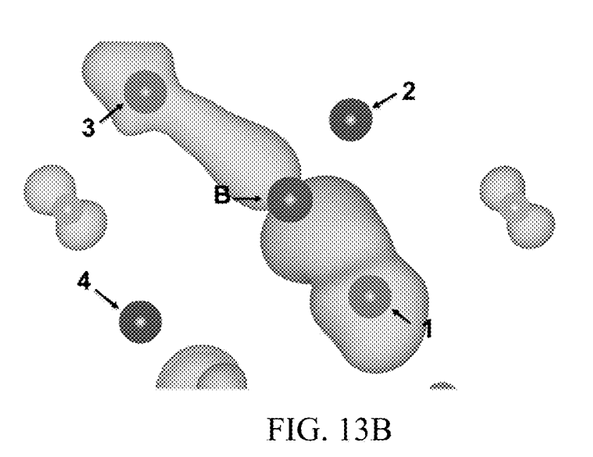

FIG. 11 shows DOS for B impurity in $Cr_2O_3$ with the actual number of electrons (panel (a)) and in the Slater transition state with ½ of an electron removed (panel (b)). The unfilled black line is the total DOS, whereas, the shaded area indicates the local DOS on the B impurity. FIG. 12 shows partial DOS on the Cr neighbors of the B impurity, where panels (a)-(d) correspond to the Cr atoms in the order of Table III shown in FIG. 9. FIGS. 13A and 13B illustrate isosurfaces of the charge density (0.034 e/Å$^3$) for the shallow impurity states shown by arrows in panel (a) of FIG. 11, where FIG. 13A shows majority spin; and FIG. 13B shows minority spin. In FIGS. 13A and 13B, Cr atoms are labeled as in Table III. Unmarked gray spheres show O ions.

FIG. 11 (panel (a)) shows the total DOS for the case of a boron impurity in the hexagonal supercell along with the partial DOS on the B atom. The impurity introduces three localized levels in the band gap. These levels originate from the B 2p states that are split by the crystal field. Due to its smaller nuclear charge, B 2p levels are pushed to even higher energies than those of N so that all of them fall in the gap. Note, however, that the impurity states have a large admixture of the 3d (mainly $e_g$) states on the nearby Cr atoms.

This is clearly seen in FIG. 12, which shows the local DOS on the Cr neighbors of the B atom and from the charge density of the impurity states. In particular, FIGS. 13A and 13B show the charge density for the shallow occupied impurity level, which is clearly a hybrid state extending between B and its Cr neighbors.

Figure 10:
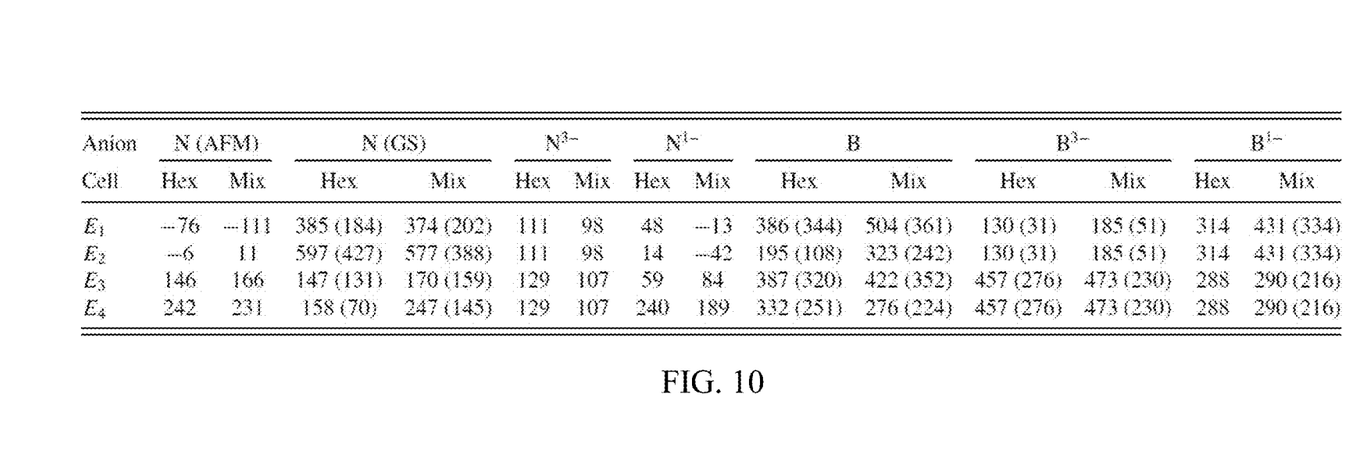
FIG. 10 shows Table IV, which indicates the exchange energies for the Cr atoms neighboring to the N and B dopants.

The exchange energies for the four Cr neighbors of the impurity B ion are listed in Table IV. As for the case of N, the relaxed energies are included in brackets where available. The exchange energies are strongly enhanced compared to bulk $Cr_2O_3$, even if relaxation is included. This enhancement is due to the impurity states mediating strong hybridization between the nearby Cr ions, which depends on the mutual orientation of the Cr spins.

Comparing the N and B impurities, it can be seen that N frustrates the AFM order around it, whereas, B reinforces it. To understand this difference, the interaction between the localized impurity states and the magnetic moments of the nearby Cr atoms is looked at in more detail. For each impurity state, on-site Hund exchange favors parallel alignment of its spin with those of the Cr atoms participating in its formation, generating ferromagnetic coupling between them. A similar mechanism can produce bound magnetic polarons in dilute ferromagnetic oxides. In the present case, this interaction is superimposed on the existing AFM order, and the magnetic ground state is determined by the best compromise between the two generally competing mechanisms.

In the N-doped system, the magnetic polaron mechanism wins over, and the magnetic ground state is obtained by aligning three of the four nearby Cr spins parallel to each other with the single filled impurity state almost fully localized on them. In the B-doped system, there are two additional shallow states in the opposite spin channels (see arrows in panel (a) of FIG. 11 and charge density in FIGS. 13A and 13B), but these states are localized on different pairs of Cr atoms. Thanks to the favorable hybridization geometry, in the AFM ground state, the Hund exchange with these states is fully saturated for all four Cr neighbors. Note that the spins on Cr sites 1 and 3 are down and those on sites 2 and 4 are up, all parallel to the spins of the localized states extending to these sites. Therefore, ferromagnetic coupling, induced by the shallow localized states, reinforces the AFM order and results in an overall enhancement of the exchange energies. According to this picture, filling of the second deep impurity level in the B-doped system, which is formed by Cr ions with opposite spins (see FIG. 12), should reduce the exchange energies. This reduction is indeed observed for the $B^{3-}$ case, particularly, if the relaxations are taken into account (see Table IV).

As discussed above for the N dopant, the position of the highest occupied impurity level can be found more accurately from the DOS in the STS, which is shown in panel (b) of FIG. 11. It is, however, seen that the corrected impurity level shifts only slightly to lower energies. The exchange energies calculated using the STS potential (as explained above for N) were found to be very close to the values listed in Table IV shown in FIG. 10.

The supercells used in the present analysis were not large enough to accurately determine the amount of the Jahn-Teller distortion in Ti-, Mn-, and Ni-doped $Cr_2O_3$. The boron-doped system is similar in this respect as seen from Tables III and IV. In particular, the exchange energy for the nearest Cr neighbor of B is much larger in the mixed supercell compared to the hexagonal one.

Figure 14A:
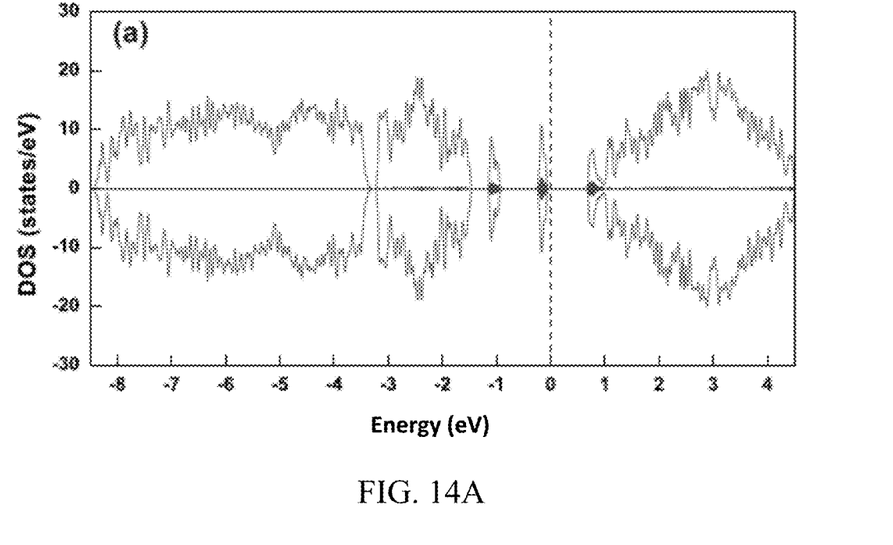
Figure 14B:
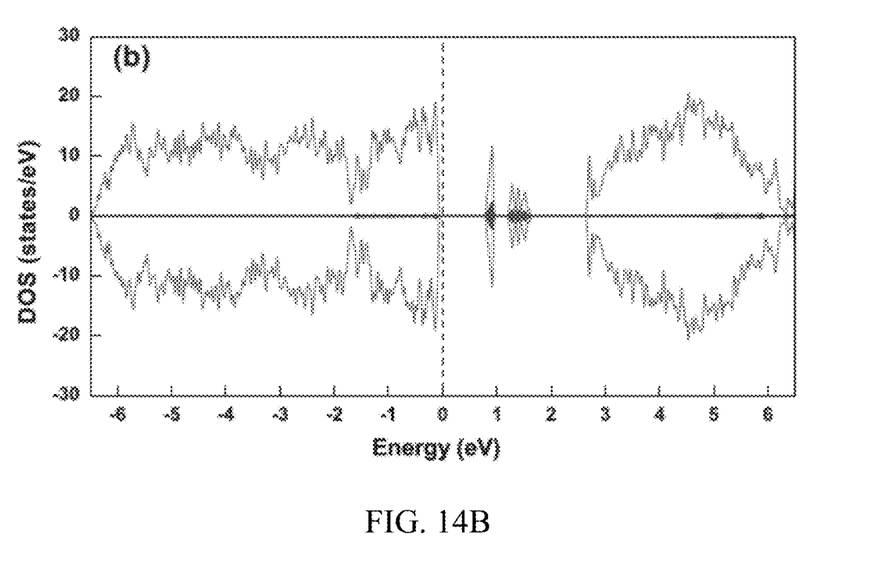

This difference, however, does not affect the overall conclusions since the average enhancement of the exchange energies around the B dopant is very high in supercells of both kinds Aliovalent $B^{3-}$ and $B^{1-}$ impurity states were also considered by introducing a homogeneous background charge. FIGS. 14A and 14B show DOS for the charged B impurities in $Cr_2O_3$. FIG. 14A shows the $B^{3-}$ state and FIG. 14B shows the $B^{1-}$ state. The solid line is total DOS; the blue shaded area shows the partial DOS on B.

As explained above, in these states, the electron count is even, and there is no Jahn-Teller distortion; full spin symmetry is, therefore, seen in the DOS plots. As expected, the addition (or removal) of an electron not only changes the occupations of the impurity states, but also shifts their positions up (or down). In the $B^{1-}$ charge state, the low-lying levels merge with the valence band. The exchange energies for the charged systems are listed in Table IV. Due to the restoration of the structural symmetry, the effect of acceptor and donor co-doping is not uniform on the different Cr neighbors of B. For $B^{1-}$, the exchange energies remain large, particularly, if the relaxations are not included.

However, as noted above, for the $B^{3-}$ charge state, the relaxed exchange energies for the two nearest Cr neighbors are reduced compared to bulk $Cr_2O_3$. Strong spin-lattice coupling does not facilitate a definite conclusion to be drawn about the effect of $B^{3-}$ impurities on $T_N$, but it is clear from the data that this charge state is, at any rate, less favorable than $B^{2-}$ or $B^{1-}$. Accordingly, anion doping with B is favorable, at least, as long as the Fermi level lies sufficiently low to avoid substitution in the $B^{3-}$ charge state. Boron doping introduces hybrid impurity states, which strongly enhance the exchange energies at the neighboring Cr ions. A rough estimate suggests that 1% B substitution can increase $T_N$ by 5%-10%. The neutral $B^{2-}$ state is favorable for the preservation of the insulating properties of $Cr_2O_3$.

The motivation for increasing $T_N$ of $Cr_2O_3$ is due to its applications in magnetoelectric devices. For these applications, it can be important that $Cr_2O_3$ retains its room-temperature insulating properties under doping. Therefore, it is preferable that the dopants do not introduce shallow donor or acceptor states. Inspecting the DOS of the three charge states considered here, it can be seen that the neutral state retains a large excitation gap of about 2 eV for both valence and conduction bands (i.e., for the transitions from the valence band to the lowest unoccupied impurity state and from the highest occupied impurity state to the conduction band). For both $B^{3-}$ and $B^{1-}$ charged states, the excitation gap is reduced to about 1 eV (FIGS. 14A and 14B). Therefore, the neutral state appears to be preferable for magnetoelectric applications. To estimate the enhancement of $T_N$ under boron doping, it is expected that each B atom substituted for O (in the 2– or 1– charge state) enhances the exchange energy on its four Cr neighbors by a factor of 2 to 3 (see Table IV). This means that $T_N$ should grow at the rate of 5%-10% per 1% of boron substitution. This enhancement is sufficiently large to be attractive for practical purposes.

It should be understood that the examples and embodiments described herein are for illustrative purposes only and that various modifications or changes in light thereof will be suggested to persons skilled in the art and are to be included within the spirit and purview of this application.

What is claimed is:

1. A magnetoelectric composition comprising:
    boron doped chromia.

2. The magnetoelectric composition of claim 1, wherein a substitution ratio of oxygen atoms of the chromia replaced by the boron is between 1% and 10%.

3. The magnetoelectric composition of claim 1, wherein a substitution ratio of oxygen atoms of the chromia replaced by the boron is about 3%.

4. The magnetoelectric composition of claim 1, having a Néel temperature of at least 400 K.

5. A voltage controlled switching device, comprising:
    boron doped chromia as an antiferromagnetic material layer, wherein the boron doped chromia comprises between 1% and 10% boron substitution for oxygen in the chromia.

6. The device of claim 5, wherein the boron doped chromia has a Néel temperature of at least 400 K.

7. The device of claim 5, wherein the device is a switchable chemical catalyst based device comprising the boron doped chromia positioned such that catalytically responsive reaction gases can be passed over a surface of the boron doped chromia and a voltage source applied to a tip over the boron doped chromia.

8. A method of fabricating a magnetoelectric material having increased critical temperature, the method comprising:
    forming a magnetoelectric composition comprising boron doped chromia by depositing chromia in the presence of borane vapor.

9. The method of claim 8, wherein depositing chromia in the presence of borane vapor comprises performing pulse laser deposition of chromia in the presence of borane vapor.

10. The method of claim 8, wherein the borane vapor comprises decaborane.

11. The method of claim 8, wherein the borane vapor comprises pentaborane.

12. The method of claim 8, wherein the borane vapor comprises diborane.

13. The method of claim 8, wherein the magnetoelectric composition comprising boron doped chromia is formed with between 1% and 10% boron substitution for oxygen in the chromia.

14. The method of claim 8, wherein the magnetoelectric composition comprising boron doped chromia is formed with about 3% boron substitution for oxygen in the chromia.

15. The method of claim 8, wherein the magnetoelectric composition comprising boron doped chromia is formed to have a Néel temperature of at least 400 K.

* * * * *